(12) United States Patent
Liu

(10) Patent No.: US 9,184,123 B1
(45) Date of Patent: Nov. 10, 2015

(54) PACKAGE SUBSTRATE WITH CURRENT FLOW SHAPING FEATURES

(71) Applicant: Altera Corporation, San Jose, CA (US)

(72) Inventor: Hui Liu, Dublin, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/464,591

(22) Filed: Aug. 20, 2014

(51) Int. Cl.
*H01L 23/498* (2006.01)
*H01L 27/02* (2006.01)
*H01L 23/50* (2006.01)
*G06F 17/50* (2006.01)
*H01L 23/538* (2006.01)
*H01L 23/532* (2006.01)

(52) U.S. Cl.
CPC ...... *H01L 23/49816* (2013.01); *G06F 17/5072* (2013.01); *H01L 23/49827* (2013.01); *H01L 23/50* (2013.01); *H01L 27/0207* (2013.01); *H01L 23/5385* (2013.01); *H01L 23/53285* (2013.01)

(58) Field of Classification Search
CPC ............. H01L 23/5385; H01L 23/53825; H01L 27/0207; H01L 23/49816; H01L 23/49827; H01L 23/50
See application file for complete search history.

(56) References Cited

U.S. PATENT DOCUMENTS

| | | | | |
|---|---|---|---|---|
| 6,711,813 | B1 * | 3/2004 | Beyne et al. | 29/852 |
| 7,233,061 | B1 * | 6/2007 | Conn | 257/686 |
| 8,866,024 | B1 * | 10/2014 | Liu et al. | 174/261 |
| 2013/0154109 | A1 * | 6/2013 | Venkatraman et al. | 257/774 |

OTHER PUBLICATIONS

"PCB Layout Recommendations for BGA Packages." Lattice Semiconductor. Apr. 2014. 55 pp.

* cited by examiner

*Primary Examiner* — Thanh V Pham
(74) *Attorney, Agent, or Firm* — Weaver Austin Villeneuve & Sampson

(57) ABSTRACT

Techniques and structures for achieving a more uniform current density in solder ball contact areas for a ball-grid-array semiconductor package are presented. Current density may be made more uniform by introducing electrically non-conductive regions into one or more areas that form a dedicated power rail within a package substrate that is configured to be connected with a die. Additionally or alternatively, the number of μvias that connect each solder ball contact area with conductive areas within the package substrate may be individually tailored based on the desired current density at each solder ball contact area.

20 Claims, 9 Drawing Sheets

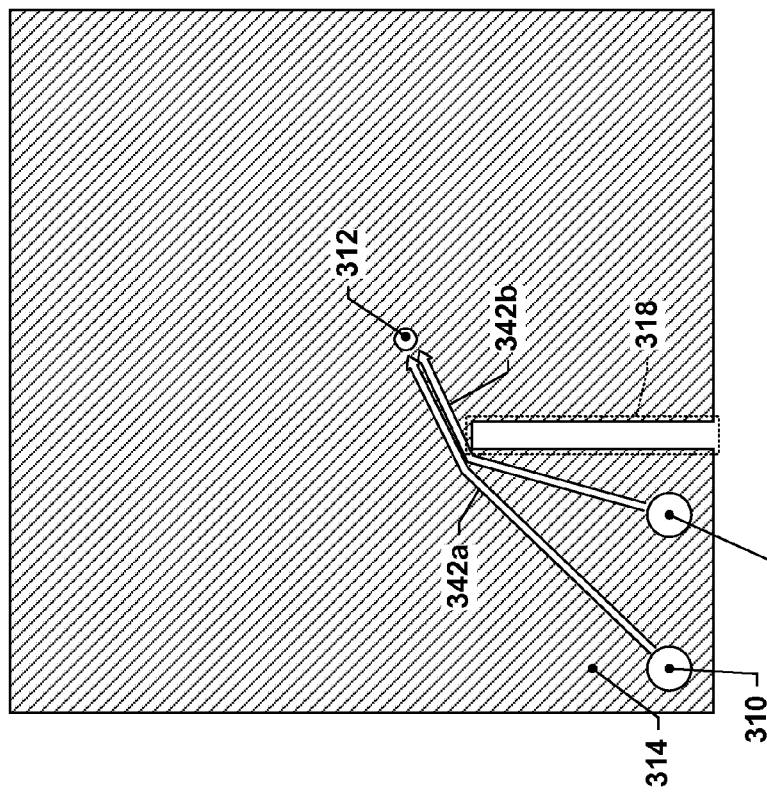
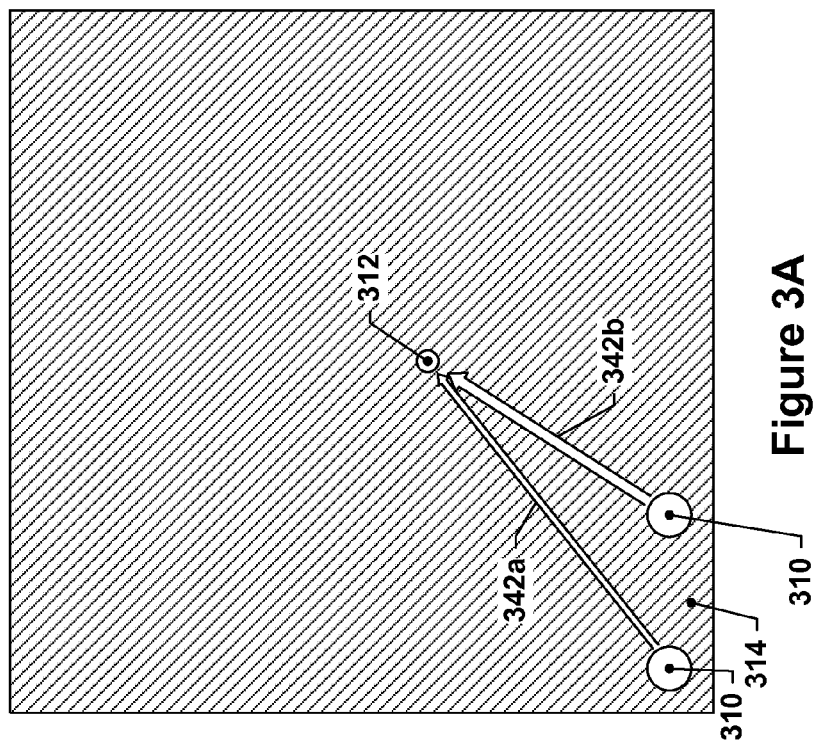

PACKAGE SUBSTRATE WITH CURRENT FLOW SHAPING FEATURES

BACKGROUND OF THE INVENTION

Due to the costs involved in manufacturing semiconductor devices and various other factors, such devices are typically manufactured en masse on a semiconductor wafer, e.g., a silicon wafer. A single silicon wafer may hold hundreds or thousands of semiconductor devices. After semiconductor processing operations are complete, the wafer may be cut apart, or "diced," to separate the individual semiconductor devices. The resulting semiconductor devices are called "dice," or, in the singular, a "die."

Due to the fact such dice are quite fragile and have feature sizes that are still quite small, it is common practice to affix a die to a package substrate to form a semiconductor package which is then sold to manufacturers of electronic devices. The package substrate is larger than the die in area and provides, among other things, structural support to the die as well as an electrical interface that serves to connect electrical contacts on the die side with electrical contacts on the opposing side that are typically larger and more widely-spaced. For example, one common way to mount a semiconductor package is to use flip-chip ball-grid-arrays (BGAs). In a BGA, a pattern of solder balls, usually a square array (often hollow in the middle), is affixed to the underside of a package substrate. Each solder ball is affixed to a contact pad on the underside of the semiconductor package. The contact pads, in turn, are electrically connected with solder bump pads on the opposing side of the package substrate through a number of conductive layers and vias within the package substrate; the solder bump pads are spaced and sized so as to connect with corresponding contact pads on the die using solder bumps. To install a BGA semiconductor package, the semiconductor package is positioned over corresponding contact pads on a printed circuit board (PCB) or similar component and then heated above the solder re-flow temperature. The solder balls then melt and, through surface tension, automatically center the semiconductor package over the contact pads on the PCB. When the solder balls cool, they form the electrical and structural connections between the semiconductor package and the PCB.

Discussed herein are techniques and structures for use in the design of package substrates for semiconductor devices.

SUMMARY OF THE INVENTION

Structures and techniques for making current densities in BGA contact pads for package substrates for semiconductor dies more uniform are discussed. Such structures and techniques may be primarily of interest with respect to power rails within the package substrate, and, more particularly, with respect to areas of conductive layers that are part of dedicated power rails and that are between the BGA-interface layer and the die-interface layer of the package substrate.

Generally speaking, the current flow within such areas may be re-shaped and, in some cases, compartmentalized as it flows from the BGA contact pads to the die contact pads of the package substrate by inserting one or more electrically-nonconductive regions into such areas. Such electrically-nonconductive regions may cause the current flow paths associated with some BGA contact pads to lengthen, thus causing current flows to redistribute themselves and causing the current density in the BGA contact pads and/or solder balls to change, e.g., to become more uniform. Furthermore, additional improvements in current density may be implemented by abandoning the industry standard of using the same fixed number of μvias for each BGA contact pad and instead specifying a number of μvias for each BGA contact pad based on the current density desired at that BGA contact pad.

In some implementations, for example, a package substrate for use with a die may be provided. The package substrate may include a plurality of layers. Each of the layers in the plurality of layers may include a pattern of electrically-conductive material. The plurality of layers may include a) a die-interface layer including one or more die contact pads configured to interface with solder bumps of the die, b) a ball-grid-array-interface (BGA-interface) layer including one or more BGA contact pads configured to interface with solder balls, and c) one or more additional layers interposed between the die-interface layer and the BGA-interface layer. The package substrate may also include a plurality of power rails. Each power rail may conductively connect one or more of the BGA contact pads with one or more of the die contact pads, and may be formed by conductively connecting one or more areas of each of two or more of the layers using inter-layer vias. In such an implementation, at least one of the additional layers may include one or more electrically-nonconductive regions arranged to produce an electrical current density that is more evenly distributed within a given power rail when i) the die is installed and ii) power is applied to the die through the package substrate as compared with the electrical current density that is produced within the given power rail when i) the one or more electrically-nonconductive regions is instead electrically-conductive, ii) the die is installed, and iii) power is applied to the die through the package substrate.

In some implementations, the package substrate may further include a dedicated power rail that includes at least a portion of the given power rail, and at least one first electrically-nonconductive region of the one or more electrically-nonconductive regions may be contiguous with one or more of the areas that are included in that dedicated power rail.

These and other implementations are discussed further below.

BRIEF DESCRIPTION OF THE DRAWINGS

The various implementations disclosed herein are illustrated by way of example, and not by way of limitation, in the figures of the accompanying drawings, in which like reference numerals may refer to similar elements.

FIG. 3A depicts an example area of a conductive layer showing current flow paths without an electrically nonconductive region.

FIG. 3B depicts the example area FIG. 3A with an electrically nonconductive region.

DETAILED DESCRIPTION

Figure 1:
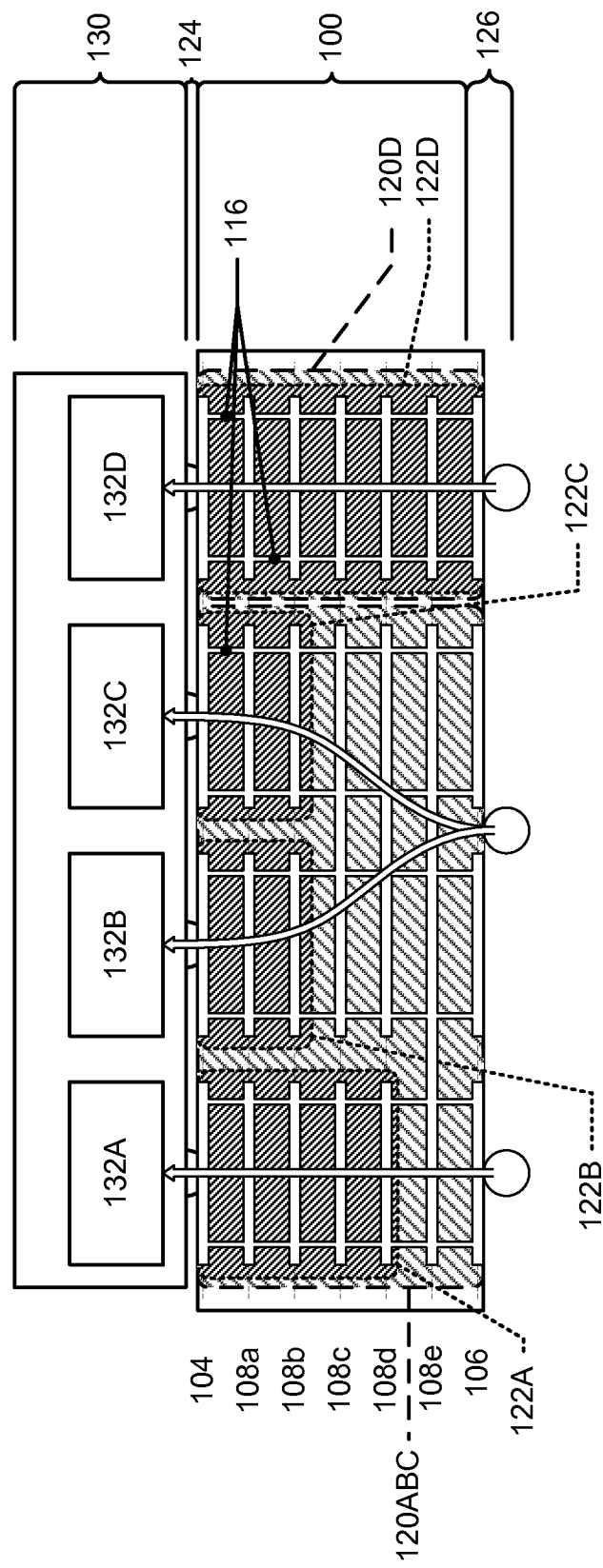
FIG. 1 depicts a simplified schematic cross-section of a package substrate with a die installed.

This disclosure relates to the design of package substrates for semiconductor packages. More specifically, this disclosure relates to techniques and structures that may be used in package substrate design to achieve a more uniform current density in, for example, BGA solder balls used to transmit core power to the semiconductor device through the package substrate.

Package substrates typically include a package core with a plurality of layers, each formed of a patterned conductive material. The layers are typically formed on a "package core," which acts as a substrate upon which the layers may be deposited. The layers may be separated from one another by insulating layers (one of which may be the package core) to electrically isolate each layer from undesired electrical contact with the other layers. As used herein, the general term "layer" refers to a layer formed of patterned conductive material, whereas the term "insulating layer" is used to refer to a layer made of insulating material. When it is necessary to electrically connect two or more of the layers, vias may be placed through the insulating layers to conductively connect the two or more layers. In essence, the layers may provide in-plane electrical conductivity within the package substrate (in directions parallel to the major plane of the package core) and the vias may provide through-plane electrical conductivity within the package substrate (in directions normal to the major plane of the package core). This allows the footprint of the semiconductor package to be larger than the footprint of the die, reducing the potential for misalignment when placing the semiconductor package on a PCB and lowering the tolerances needed in (and thus expense of) equipment that places semiconductor packages on PCBs.

Semiconductor devices typically utilize several different types of electrical signals in order to properly function. For example, a typical semiconductor device may require a power supply signal that provides overall power to the semiconductor device (referred to as "core power"), one or more secondary power supply signals that provide power to various subsystems within the semiconductor device (frequently, although not necessarily, at different voltage or current levels from the core power), one or more input signals that are used to provide inputs to the semiconductor device, and one or more output signals that are used to provide output from the semiconductor device. Power signals are distinct from input and output signals in that they typically are intended to remain at fixed levels during operation of the semiconductor device, whereas input and output signals are intended to communicate information through alterations in their electrical characteristics.

Core power is provided to a die by applying a power signal to solder balls of the BGA that are in electrically-conductive contact with the core-power solder bumps of the die via the vias and layers of the substrate package. Such current flow-paths are referred to as "power rails" in this disclosure and the term "power rail" is to be understood to refer to an electrically-conductive path for providing power signals to a die that is formed by connecting regions of the electrically-conductive layers of a package substrate with one another through at least a portion of the package substrate using electrically-conductive vias. Each power rail is conductively connected with one or more solder balls and is used to provide power supplied through those one or more solder balls to one or more different sets of circuits within the die.

FIG. 1 depicts a simplified schematic cross-section of a package substrate with a die installed. As can be seen, a die 130 may be affixed to a package substrate 100 via solder bumps 124. The die may include four circuit sets 132A, 132B, 132C, and 132D, each of which is electrically isolated from the other sets of circuits within the die. The package substrate may receive power via a plurality of solder balls 126.

The package substrate 100 may include a plurality of layers including, for example, a die interface layer 104, a BGA-interface layer 106, and, in this example, five additional layers 108a, 108b, 108c, 108d, and 108e. Gaps in each layer 104, 106, 108a, 108b, 108c, 108d, and 108e represent electrical that the portions of each layer between the gaps are electrically isolated from one another within that layer. For example, additional layer 108a has four areas that are electrically isolated from one another within that layer, whereas additional layer 108e has only two areas that are electrically isolated from one another within that layer. Each of the layers may be connected with one or more other layers using one or more vias 116. Of course, areas that are electrically isolated from one another intra-layer may be conductively connected with one another by vias 116 and one or more areas from other layers.

Two power rails are depicted in FIG. 1. Power rail 120ABC provides power supplied to the left and center solder balls to circuit sets 132A, 132B, and 132C; power rail 120D provides power supplied to the right solder ball to circuit set 132D.

As noted above, a power rail may provide power to one or more different sets of circuits within the die. These different sets of circuits may, within the die, be electrically isolated from one another during normal operation of the die. These circuits may, although not always, be connected with one another in an electrically-conductive manner once the die is installed on the package substrate since they may be conductively connected via the power rail within the package substrate.

The term "dedicated power rail" is used herein to refer to a power rail, or sub-portion of a power rail, that provides electrical power to a set of circuits in a die that are electrically isolated, within the die, from any other sets of circuits in the die. Dedicated power rails are bounded on one side by the die interface layer and extend through the thickness of the package substrate up to, but not including, the first electrically-conductive layer that would conductively connect corresponding set of circuits with at least one of the other sets of circuits in the die.

With respect to FIG. 1, four dedicated power rails are shown—dedicated power rail 122A, which extends from the die-interface layer 104 to additional layer 108d; dedicated power rails 122B and 122C, which extend from the die-interface layer 104 to additional layer 108b; and dedicated power rail 122D, which extends from the die-interface layer 104 to BGA-interface layer 106. As can be seen, none of circuit sets 132A, 132B, 132C, and 132D are conductively connected with one another within the package substrate 100 via any of their respective dedicated power rails.

Within the industry, it is considered to be good practice to use only one contiguous area within each additional layer for a given dedicated power rail and to minimize the distance that current must flow within the area to flow from any via to any other via. The conventional thinking is that this promotes current flow within the package substrate. Generally speaking, the only time that package substrate designers may depart from such conventions are when a discontinuity needs to be inserted to accommodate other areas within an additional layer that are part of a different circuit, e.g., to accommodate via feed-throughs that do not electrically connect with the area, or to accommodate intra-layer circuit traces that do not electrically connect with the area. The present inventor has realized, however, that in certain instances, such practices may cause current to concentrate to unacceptable levels in some devices. More specifically, the present inventor has determined that as core power requirements for semiconductor devices increase, feature size decreases, and ball availability for power decreases, such practices may cause non-uniformities in current density across the solder balls of the BGA. Such non-uniformities may result in some of the solder balls having a current density, e.g., 1.4 Å/solder ball, that exceeds an allowable maximum current density, e.g., 1.25 Å/solder ball.

The present inventor has determined that introducing various non-conductive regions within the area of an additional layer that is part of a dedicated power rail may cause the current that flows within that area to re-distribute itself within that area. This re-distributed current flow cascades into subsequent layers between the additional layer that has the non-conductive region and the BGA-interface layer, resulting in a more evenly distributed current flow at the BGA interface layer as compared to a similar implementation that does not have the non-conductive regions. This, in turn, allows the current density in the BGA contact pads and/or BGA solder balls to be made more uniform for a given dedicated power rail, e.g., the variance of the current density of such BGA solder balls or contact pads may decrease.

Figure 2:
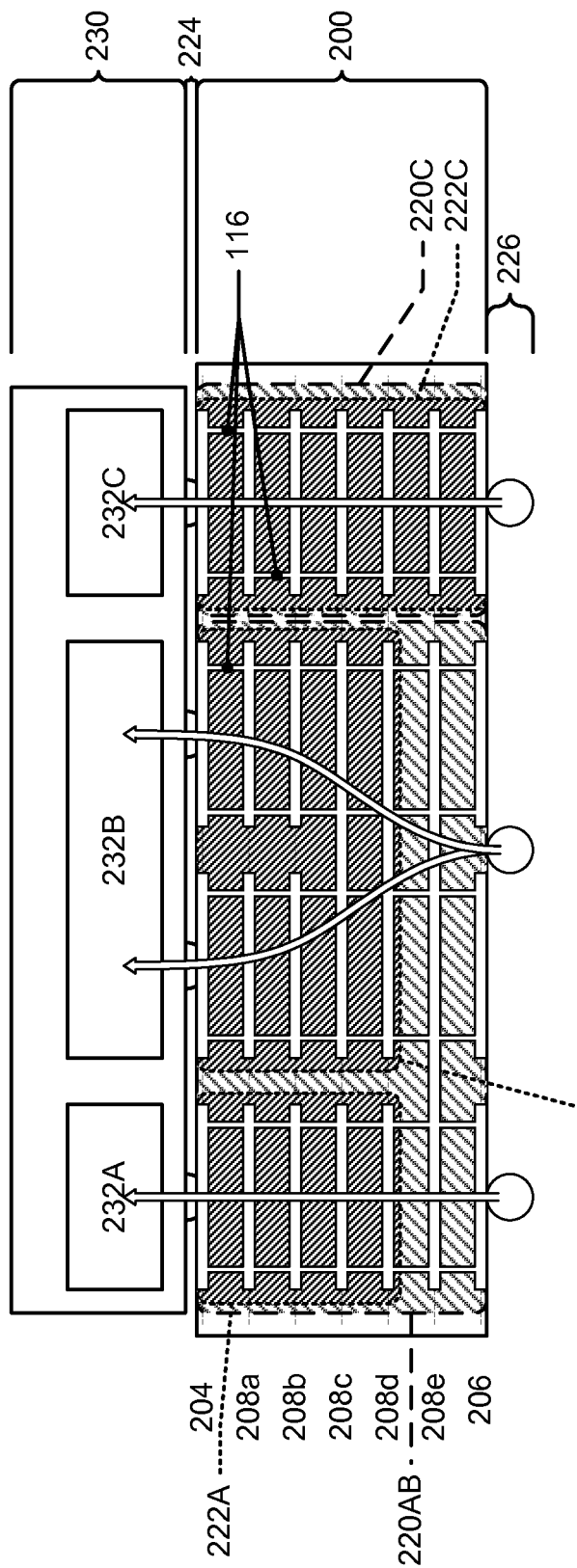
FIG. 2 depicts another simplified schematic cross-section of a package substrate with a die installed.

FIG. 1 depicts a simplified schematic cross-section of a package substrate with a die installed and featuring dedicated power rails with areas having one or more non-conductive regions within a layer. FIG. 2 is identical to FIG. 1, with the exception that there are only three circuit sets 232A, 232B, and 232C, and only three corresponding dedicated power rails 222A, 222B, and 222C. Otherwise, the diagrams are the same. Structures in FIG. 2 that are similar to structures in FIG. 1 are indicated with callouts featuring the same last two numbers as the corresponding structures in FIG. 1, and the reader is referred to the discussion of FIG. 1 above for descriptions of these components.

As noted above, there are three circuit sets 232A, 232B, and 232C, and three corresponding dedicated power rails 222A, 222B, and 222C shown in FIG. 2. Dedicated power rail 222A and circuit set 232A correspond with dedicated power rail 122A and circuit set 132A of FIG. 1, whereas dedicated power rail 222C and circuit set 232C correspond with dedicated power rail 122D and circuit set 132D of FIG. 1. Circuit sets 132B and 132C have been replaced, however, by a single circuit set 232B. This results in a single dedicated power rail 222B that extends from the die-interface layer 204 to the additional layer 208*d*.

Normally, per industry practice, there would be no electrical isolation between the portions of the additional layers 208*a* and 208*b*, as this would run counter to the conventional practice of minimizing hindrances to current flow within an area of a layer that is part of a dedicated power rail. However, as can be seen, such electrical isolation has been introduced here, as evidence by the gaps between areas of additional layers 208*a* and 208*b* within the dedicated power rail 222B.

As discussed above, industry practice is to use only one contiguous area within each additional layer for a given dedicated power rail and to minimize the distance that current must flow within the area to flow from any via to any other via. The present inventor has determined that such practice contributes to the presence of hot spots, i.e., areas of higher-than-average current density, in the solder balls (or their contact pads) that may exceed allowable thresholds for current density. The present inventor has further determined that the deliberate introduction of electrically-nonconductive discontinuities or regions into an area of an additional layer that is part of a dedicated power rail may be used to modify the current flow within the package substrate so as to even out the current density distribution across the solder balls of the BGA.

This principle is discussed further with respect to FIGS. 3A and 3B. FIG. 3A depicts an example area of a conductive layer showing current flow paths without an electrically nonconductive region. FIG. 3B depicts the example area FIG. 3A with an electrically nonconductive region.

FIGS. 3A and 3B are simplified representations; they "collapse" the multiple-layer aspect of a package substrate into a single layer for ease of discussion. In reality, the current flow paths through the package substrate would be much more complex, and would involve multiple areas (likely of different sizes and geometries) and multiple layers. However, the simplified representation of FIGS. 3A and 3B may serve as useful illustrations for the discussion of certain concepts.

In FIG. 3A, two BGA contact pads 310 are represented, as is a die contact pad 312; all of the contact pads are conductively connected through area 314. Arrows 342*a* and 342*b* indicate current flows from the BGA contact pads 310 to the same die contact pad 312. Current flow 342*a* must travel through a longer distance than current flow 342*b* to reach the die contact pad 312, and is thus subject to greater resistance (assuming that the area 314 is a constant thickness), which reduces the current (evidenced in FIGS. 3A and 3B by the width of the arrows 342*a*/b). As such, the current density through the left BGA contact pad 310 in FIG. 3A is less than the current density through the right BGA contact pad 310 in FIG. 3A.

In FIG. 3B, an electrically nonconductive region 318 has been inserted into the area 314. This electrically nonconductive region 318 forces the current flows from both BGA contact pads 310 to be rerouted, although the current flow from the right BGA contact pad 310 is rerouted to a greater extent than the current flow from the left BGA contact pad 310. As a result of such re-routing, the disparity in current flows between the left BGA contact pad 310 and the right BGA contact pad 310 is reduced, resulting in a more uniform current density between the two BGA contact pads 310.

Such electrically-nonconductive regions may be broken down into two basic categories: (a) electrically-nonconductive regions that are contiguous with, and result in the electrical isolation of, two or more areas within a layer that are both part of the same dedicated power rail and (b) electrically-nonconductive regions that are contiguous with an area of a of a layer (where the area is also part of a dedicated power rail) and that extend into the area from an edge of the area, much like an inlet.

Figure 4:
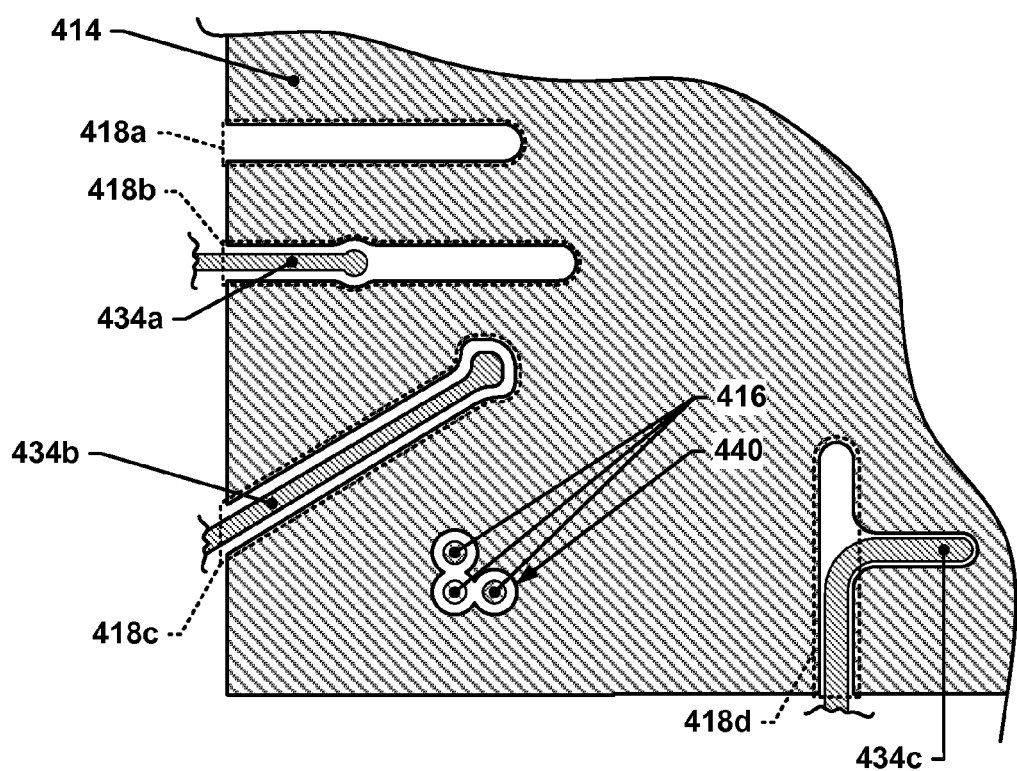
FIG. 4 depicts various types of non-conductive regions that may be present in an area of an additional layer.

FIG. 4 depicts various types of non-conductive regions that may be present in an area of an additional layer. Visible in FIG. 4 is an area 414 of an additional layer such as additional layers 108*a*, 108*b*, 108*c*, 108*d*, and 108*e* or additional layers 208*a*, 208*b*, 208*c*, 208*d*, and 208*e*.

As discussed above, such an area 414 may have discontinuities in it to facilitate through-vias, i.e., vias that must pass through the layer without coming into conductive contact with the layer, such as vias 416. Such through-vias are typically isolated from the area 414 by a via moat 440, which is typically sized and toleranced large enough so as to preclude conductive contact between the vias 416 and the area, but are, at the same time, typically kept to a minimum allowable size (or close to it) to avoid needlessly disrupting current flow within the area—at least, as far as industry standard practice is concerned.

Also visible in FIG. 4 are electrically-nonconductive regions 418a, 418b, 418c, and 418d, all of which take the form of an inlet that protrudes into the area 414 (type "(b)" in the above description of electrically-nonconductive regions). In some situations, an inlet that is necessary to accommodate some other feature, e.g., a circuit trace belonging to some other circuit that must stay electrically isolated from the area 414, may be placed or routed such that it not only provides the necessary electrically isolation for a circuit trace routing, but also acts as an electrically-nonconductive region that promotes current density redistribution. An example of such an electrically-nonconductive region is shown by electrically-nonconductive region 418c, which accommodates circuit trace 434b.

In some instances, the electrically-nonconductive region that is necessary to electrically isolate a circuit trace from the area 414 may be extended beyond the point at which it is necessary to electrically isolate the circuit trace from the area 414. Such is the case with electrically-nonconductive region 418b and circuit trace 434a. A similar scenario is illustrated with respect to electrically-nonconductive region 418d and circuit trace 434c, except that the electrically-nonconductive region 418d has been extended from a point lying along the circuit trace as opposed to from the end of the circuit trace. In some implementations where an electrically-nonconductive region also includes a circuit trace feature for only part of the path length of the electrically-nonconductive region, the electrically-nonconductive region may have a path length that is free of such a circuit trace for at least 25%, 50%, 75%, or 100% of the length of the electrically-nonconductive region.

Finally, in circumstances where no circuit trace needs to be routed into the area 414, an electrically-nonconductive region such as electrically-nonconductive region 418a may be used. Such an electrically-nonconductive region may be completely free of such circuit traces (or even of any other features). Such electrically nonconductive regions may thus be, in some implementations, for a single purpose, i.e., making BGA contact pad current density more uniform.

Figure 5B:
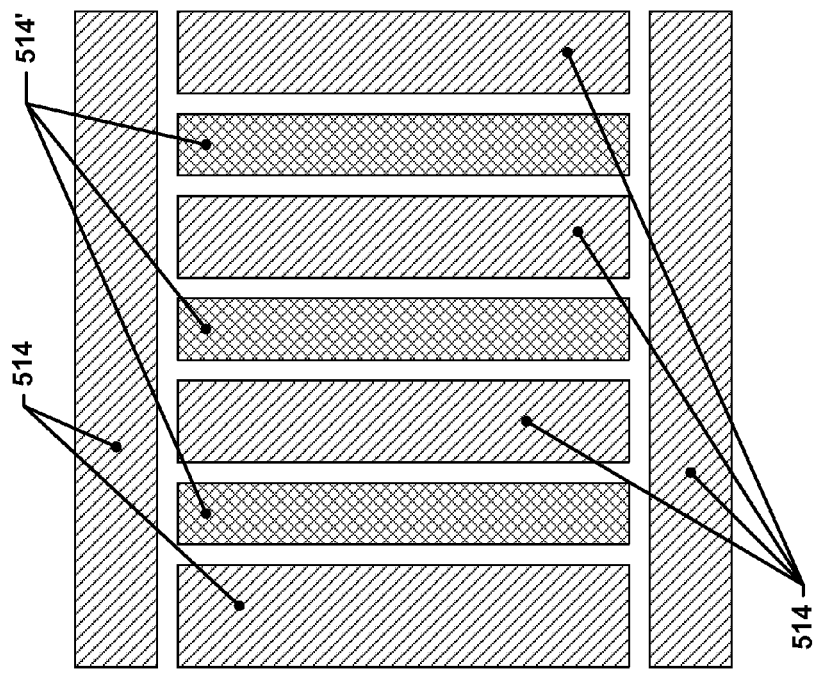
FIG. 5B depicts an example of areas for a dedicated power rail partitioned into islands with electrically-nonconductive regions.
Figure 5A:
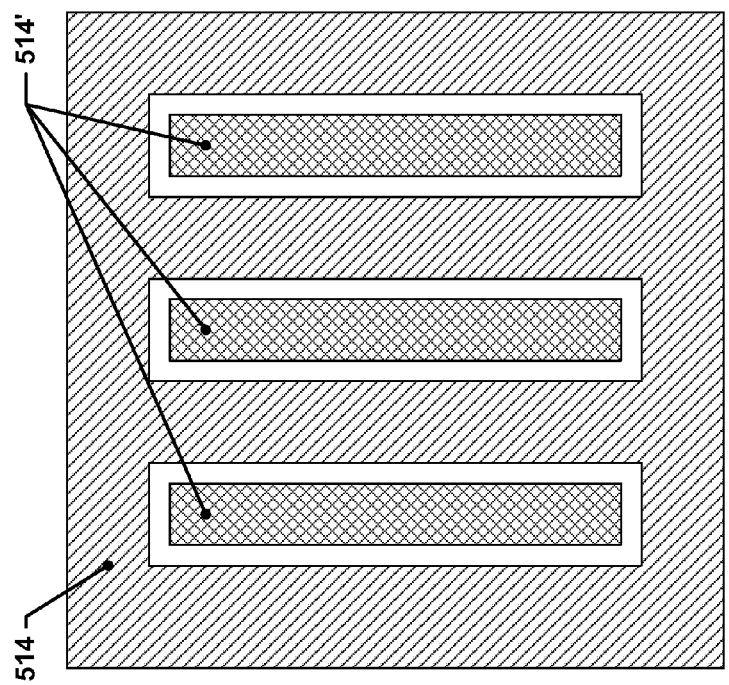
FIG. 5A depicts an example of an area for a dedicated power rail with three areas from another circuit located within the area.

FIG. 5A depicts an example of an area for a dedicated power rail with three areas from another circuit located within the area. FIG. 5B depicts an example of areas for a dedicated power rail partitioned into islands with electrically-nonconductive regions. In FIG. 5A, an area 514 of an additional layer is shown that may be part of a dedicated power rail. Three areas 514' are also shown, which may also be on the same additional layer but are part of a separate circuit (or circuits); they are thus isolated from the area 514. In FIG. 5B, the area 514 has been divided up into multiple islands (six total) by the electrically nonconductive regions. Thus, current passed into each island is free to flow to the extents of the island before flowing through one or more vias to another layer, but is not free to flow from island to island within the additional layer.

Figure 6:
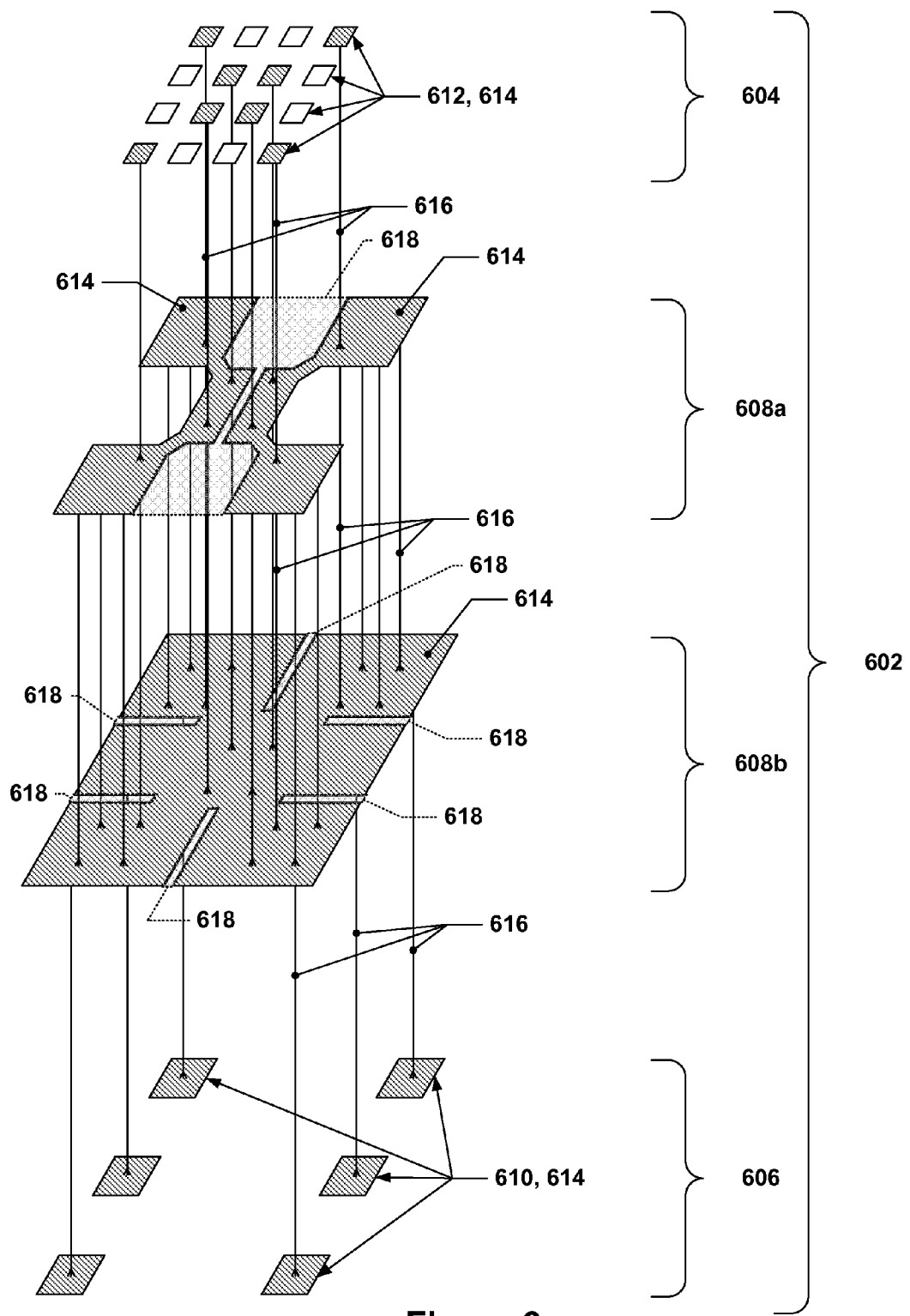
FIG. 6 depicts an exploded schematic view of areas of several layers of a package substrate.

In some implementations, electrically-nonconductive regions may be used in more than one additional layer of a dedicated power rail. FIG. 6 depicts an exploded schematic view of areas of several layers of a package substrate. In FIG. 6, areas from a plurality of layers are shown. For example, a die interface layer 604 is shown that includes 16 areas 614 that are also die contact pads 612. In this example, the die contact pads 612 that are filled in with crosshatching represent core power die contact pads and are all configured to connect to a common set of circuits within the die.

Each die contact pad 612 is connected by a via 616 to one of two areas 614 located in additional layer 608a. The two areas 614 in the additional layer 614 are separated by an electrically-nonconductive region 618. The two areas 614 may, in turn, each be connected with an area 614 in another additional layer 608b. The area 614 in the additional layer 608b may be a single contiguous area and may include a number of electrically-nonconductive regions 618, which, in this example, take the form of inlets that extend into the area 614 from the edges of the area 614.

The area 614 of the additional layer 608b may then be connected with further vias 616 to BGA contact pads 610, which may be areas 614 of a BGA-interface layer 606.

The cross-hatched areas of the layers of FIG. 6 may, in this example, form a dedicated power rail. As can be seen, both additional layers 608 in this example include electrically-nonconductive regions 618 that may cause current to flow through the BGA interface layer 606 in a more evenly-distributed manner than such current would flow in the absence of such regions.

In addition to the inclusion of electrically-nonconductive regions in an area (of a dedicated power rail) of an additional layer, additional structural features may be included to render the current density at the BGA contact pads even more uniform. Such additional structural features may include, for example, a varying number of μvias (microvias) that are used to provide each via. In the above discussion, mention has been made of vias that may connect different layers together in an electrically conductive manner. In actual practice, such vias may be provided using one or more μvias. μVias are formed in the insulating layers that are interposed between the layers and are, in production environments, frequently formed in holes formed using laser drills due to their speed and reliability. After the hole is drilled, it is electroplated or otherwise coated with a conductive material to conductively connect the layers on either side of the hole. As a result, μvias typically have the shape of hollow tubes. It is common practice to use a common pattern of multiple μvias for one via, e.g., a square pattern of four μvias, to increase conductivity through the via and to serve as a multiply-redundant conductive path in the event that one or several of the μvias fails.

Figure 7:
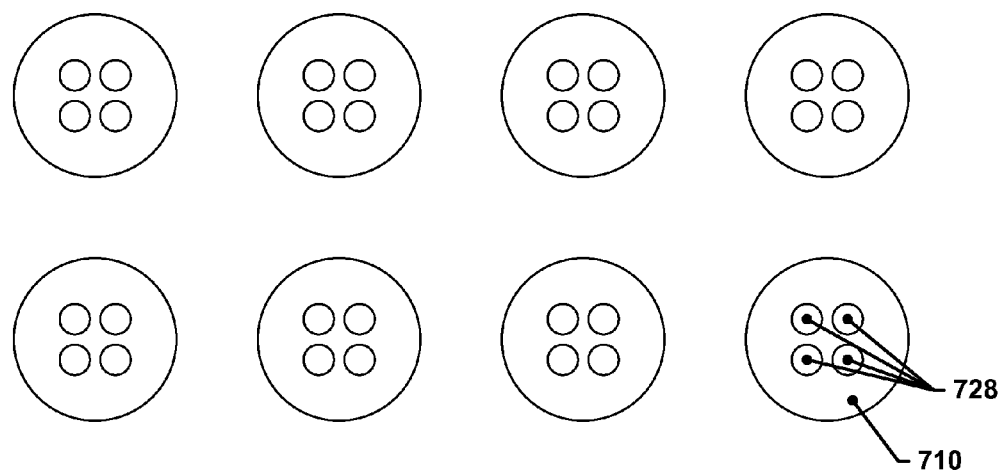
FIG. 7 depicts an example set of 8 standard BGA contact pads, each with an industry-standard pattern of 4 μvias centered inside.

The present inventor has realized that tuning the number of μvias that are used to connect each BGA contact pad with one of the additional layers may allow for further tuning of the current density in each BGA contact pad. For example, FIG. 7 depicts a set of 8 standard BGA contact pads 710, each with an industry-standard pattern of 4 μvias 710 centered inside. These contact pads 710 thus all have the same overall conductivity and, if varying amounts of current were to be applied to each one, each would experience a different current density.

Figure 8:
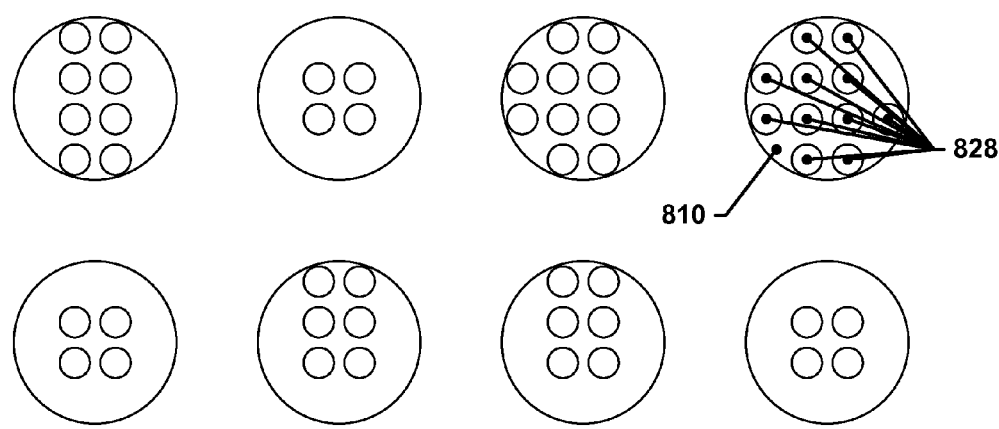
FIG. 8 depicts the same example set of 8 BGA contact pads as shown in FIG. 7, but with a variable number of μvias per BGA contact pad.

In contrast, FIG. 8 depicts the same set of 8 BGA contact pads 710, but each BGA contact pad 710 has a number of μvias that is determined based on the expected current flow through that BGA contact pad 710. Thus, the BGA contact pad 710 that is located in the upper left has 8 μvias, which gives it the ability to handle twice as much current at the same current density as may be handled by its neighbor to the right, which only has 4 μvias. In actual practice, this tuning capability may be somewhat digital in nature, as manufacturing techniques currently in use generally require the use of only one size of μvia (it is expensive and time-consuming to change the drill size) and the BGA contact pad diameter may set an upper limit on how many μvias may fit within the boundaries of the BGA contact pad. For example, for a typical BGA contact pad of ~600 μm, it may be possible to comfortably fit between 1 and 12 μvias of 90 μm to 100 μm within the boundary of the BGA contact pad. Thus, there may be approximately 12 different conductivity values to select from when attempting to more evenly distribute the current densities between BGA contact pads.

Since each solder ball for a dedicated power rail may typically be connected to multiple solder bumps in an electrically conductive manner, and vice versa, the current flow within the dedicated power rail may be quite complex. For example, if one views the shortest current flow paths between a solder ball and the various solder bumps that it may be connected to, each current flow path may vary in effective resistance (which is a function of current flow path length, current flow path cross section, quality of via connections, etc.) which, in turn changes the amount of current that flows along that current flow path. Thus, solder balls connected to solder bumps by current flow paths with higher average effective resistances will conduct less current (and thus have lower current density) than solder balls that are connected to solder bumps by current flow paths with lower average effective resistances and that, accordingly, conduct more current (and thus have higher current density).

From a practical standpoint, the placement of electrically nonconductive regions in an area forming part of a dedicated power rail may be determined based on a starting assumption that such electrically nonconductive regions should be generally positioned so as to lengthen the shortest current flow path lengths from one or more solder balls having high-current-density while generally avoiding commensurate increases in the shortest current flow path lengths from one or more solder balls having lower current density. After placing one or more such electrically nonconductive regions in one or more areas forming part of a dedicated power rail, computer simulation or physical testing may be performed to determine the effect that the newly-placed electrically nonconductive regions have on effective resistances associated with each solder ball connection and, accordingly, the effect that such electrically nonconductive regions have on the current densities of the solder ball connections. Various optimization schemes and heuristics may be used to guide this process as experience is gained from repeated experiments, real or simulated, for different configurations of electrically nonconductive regions within one or more areas of a dedicated power rail. For example, in some implementations, the type, size, shape, and orientation of such electrically nonconductive regions may be determined by resorting to an analysis using Monte Carlo methods.

Figure 9:
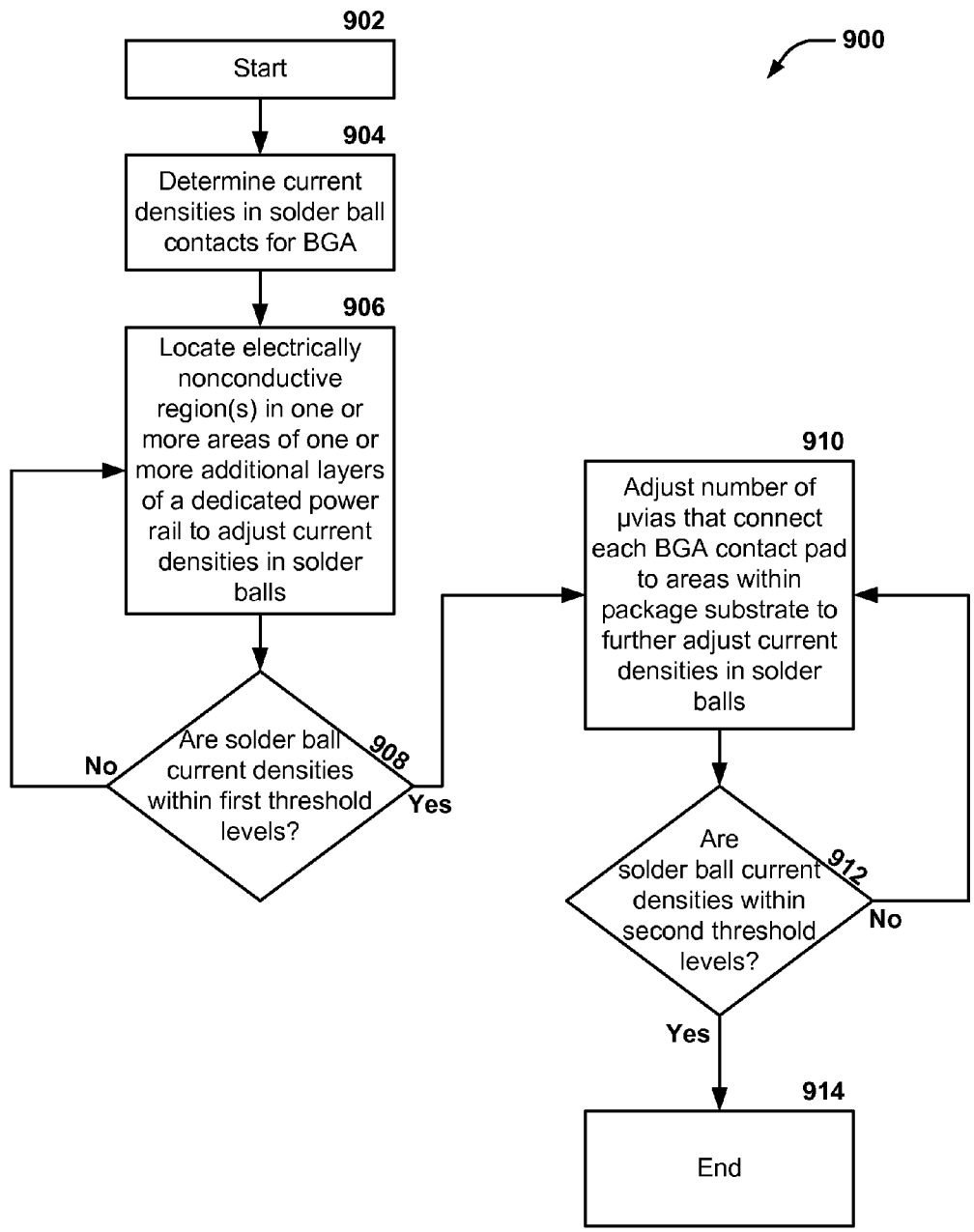
FIG. 9 depicts a flow diagram for one technique for adjusting BGA contact pads of a package substrate for more uniform current densities.

FIG. 9 depicts a flow diagram for one technique for adjusting BGA contact pads of a package substrate for more uniform current densities. The technique 900 begins in block 902, and then proceeds to block 904, in which current densities for solder ball contacts of a BGA are evaluated for a given package substrate design. After current densities in the current design have been determined, the technique proceeds to block 906, in which one or more electrically nonconductive regions may be located/positioned within one or more areas in one or more additional layers of a dedicated power rail. As discussed above, such electrically nonconductive regions may take the form of inlets, i.e., regions that do not electrically isolate two areas from one another within the same additional layer, regions that do electrically isolate two areas within the same additional layer and the same dedicated power rail from one another to form islands, or a combination of both types of regions.

In block 908, the current densities in the solder ball contacts for the BGA may be re-determined to reflect the effect of the electrically nonconductive regions. If the current densities of the solder ball contacts are each within a first threshold amount, then the technique may proceed to block 910. If not, the technique may return to block 906 for further adjustment of the location, type, size, etc. of electrically nonconductive regions in the additional layer(s) of the dedicated power rail.

In block 910, the number of μvias that are used to connect each solder ball contact pad with areas within the package substrate may be adjusted, e.g., increased or decreased, depending on the current densities achieved with the electrically nonconductive regions of block 906. If a particular solder ball contact pad has too high a current density, then the number of μvias may be increased; conversely, if a particular solder ball contact pad has too low a density, then fewer μvias may be used.

In block 912, a determination may be made as to whether the solder ball contact pad current densities are within a second threshold (the second threshold may be more strict than the first threshold). If yes, then the technique may end in block 914. If not, then further refinement of the number of μvias used in each solder ball contact pad may be performed.

It is to be understood that the various blocks in the technique outlined in FIG. 9 may be modified in terms of order or even whether or not they are performed. For example, it is to be understood that the use of electrically nonconductive regions in a dedicated power rail and the use of varying numbers of μvias are not necessarily both required in order to achieve a desired level of current density uniformity; in some implementations, only one of these techniques and structures may be used, depending on the requirements. In other implementations, block 912 may return to block 906 instead of block 910. Such alternative implementations, as well as others not disclosed in detail herein, are considered to be within the scope of this disclosure.

While the above discussion has focused on the application of electrically nonconductive regions to areas of dedicated power rails for core power supply to a die, such practices and structures may also be used with other dedicated power rails within a given package substrate, and such other implementations are also within the scope of this disclosure. Such techniques may be most relevant to the core power dedicated power rail(s) since such dedicated power rails typically carry the most current in a package substrate.

Figure 10:
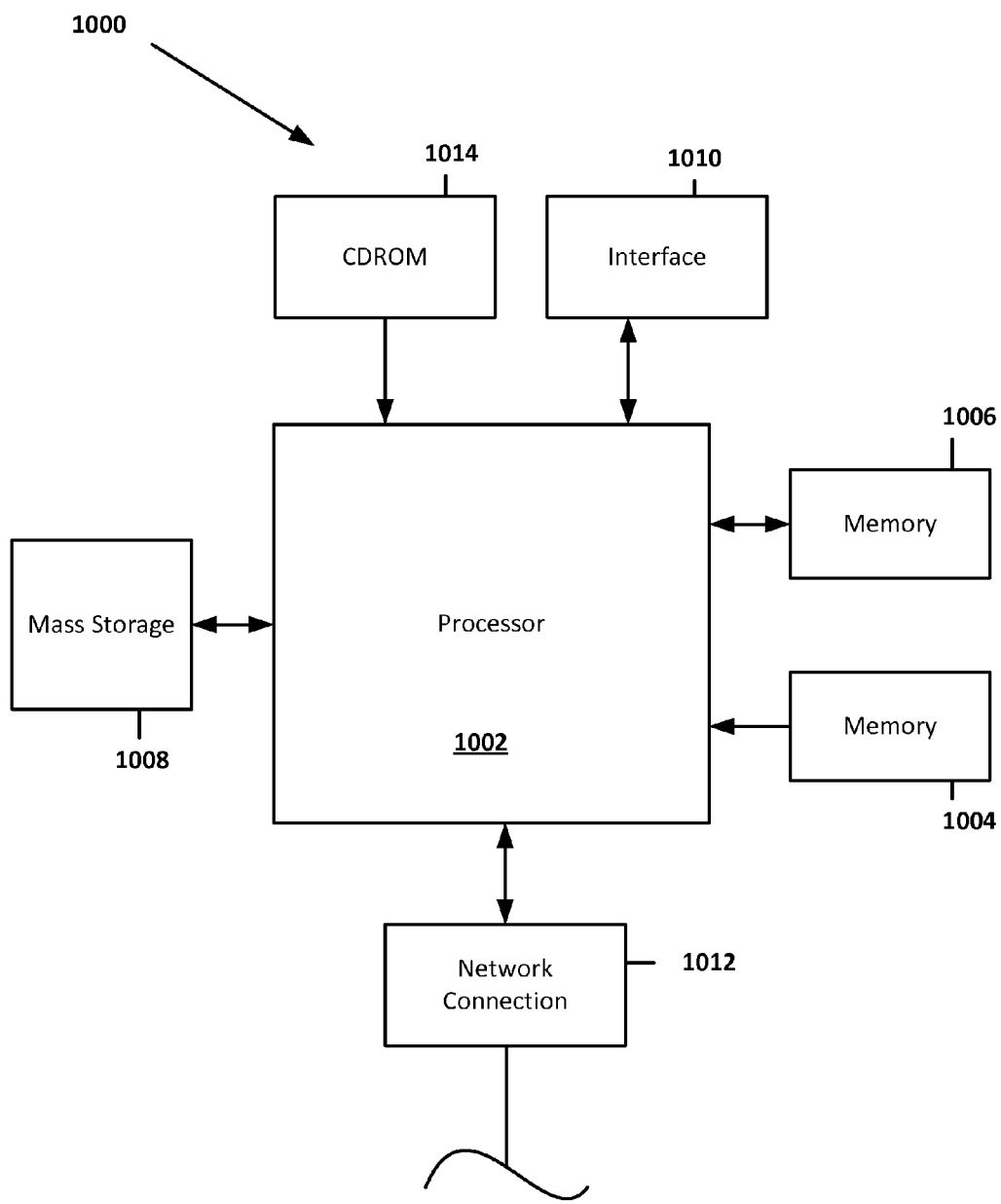
FIG. 10 illustrates one example of a computer system that may use a die with a package substrate such as is described herein.

FIG. 10 illustrates one example of a computer system that may use a die with a package substrate such as is described herein. The computer system 1000 may include any number of processors 1002 (also referred to as central processing units, or CPUs) that are coupled to devices including memory 1006 (typically a random access memory, or "RAM"), memory 1004 (typically a read only memory, or "ROM"). The processors 1002 can be configured to generate an electronic design. As is well known in the art, memory 1004 acts to transfer data and instructions uni-directionally to the CPU and memory 1006 are used typically to transfer data and instructions in a bi-directional manner.

Both of these memory devices may include any suitable type of the computer-readable media described above. A mass storage device 1008 may also be coupled bi-directionally to CPU 1002 and provides additional data storage capacity and may include any of the computer-readable media described above. The mass storage device 1008 may be used to store programs, data and the like and is typically a secondary storage medium such as a hard disk that is slower than memory. The mass storage device 1008 may be used to hold a library or database of prepackaged logic or intellectual property functions, as well as information on generating particular configurations. It will be appreciated that the information retained within the mass storage device 1008, may, in appropriate cases, be incorporated in standard fashion as part of memory 1006 as virtual memory. A specific mass storage device such as a CD-ROM 1014 may also pass data unidirectionally to the CPU.

CPU 1002 may also be coupled to an interface 1010 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1002 may be a design tool processor. Finally, CPU 1002 optionally may be coupled to a computer or telecommunications network using a network connection as shown generally at 1012. With such a network connection, it is contemplated that the CPU might receive information from the network, or might output information to the network in the course of performing the above-described process steps. It should be noted that the system 1000 might also be associated with devices for transferring completed designs onto a programmable chip. The above-described devices and materials will be familiar to those of skill in the computer hardware and software arts.

Although many of the components and processes are described above in the singular for convenience, it will be appreciated by one of skill in the art that multiple components and repeated processes can also be used to practice the techniques of the present invention.

While particular embodiments of the invention have been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. A package substrate for use with a die, the package substrate comprising:
 a plurality of layers, wherein:
  each of the layers in the plurality of layers includes a pattern of electrically-conductive material, and
  the plurality of layers includes:
   a) a die-interface layer including one or more die contact pads configured to interface with solder bumps of the die,
   b) a ball-grid-array-interface (BGA-interface) layer including one or more BGA contact pads configured to interface with solder balls, and
   c) one or more additional layers interposed between the die-interface layer and the BGA-interface layer; and
 a plurality of power rails, each power rail:
  conductively connecting one or more of the BGA contact pads with one or more of the die contact pads, and
  including interlayer vias conductively connecting one or more areas of each of two or more of the layers, wherein:
   at least one of the additional layers includes one or more electrically-nonconductive regions arranged to produce an electrical current density that is more evenly distributed within a given power rail when i) the die is installed and ii) power is applied to the die through the package substrate as compared with the electrical current density that is produced within the given power rail when i) the one or more electrically-nonconductive regions is instead electrically-conductive, ii) the die is installed, and iii) power is applied to the die through the package substrate.

2. The package substrate of claim 1, further comprising a dedicated power rail that includes at least a portion of the given power rail, wherein at least one first electrically-nonconductive region of the one or more electrically-nonconductive regions is contiguous with one or more of the areas that are included in the dedicated power rail.

3. The package substrate of claim 2, wherein:
 the at least one first electrically-nonconductive region electrically isolates a plurality of areas in a first layer of the plurality of layers from one another within the first layer, and
 the plurality of areas in the first layer that are electrically isolated from one another by the at least one first electrically-nonconductive region are included in the dedicated power rail.

4. The package substrate of claim 3, wherein:
 a second layer of the plurality of layers is located opposite the first layer from the die-interface layer and includes at least one second electrically-nonconductive region, and
 the at least one second electrically-nonconductive region is contiguous with a single area of the second layer that is electrically connected with two of the areas in the first layer that are electrically isolated from one another within the first layer by the at least one first electrically-nonconductive region.

5. The package substrate of claim 2, wherein:
 the at least one first electrically-nonconductive region includes at least one inlet of width Y and length X that extends into one of the one or more areas of a layer area from the outer perimeter of that area, and
 X is greater than Y.

6. The package substrate of claim 2, wherein:
 the at least one first electrically-nonconductive region includes at least one first electrically nonconductive region that has a width Y and a path length X,
 the width Y is smaller than the path length X, and
 the at least one first electrically nonconductive region that has the width Y and the path length X is devoid of circuit traces within the layer that includes the first electrically nonconductive region for at least a substantial portion of the path length X.

7. The package substrate of claim 6, wherein X is at least four times larger than Y.

8. The package substrate of claim 6, wherein the substantial portion of the path length X is selected from the group consisting of: 25% of X, 50% of X, 75% of X, and 100% of X.

9. The package substrate of claim 8, wherein the substantial portion of the path length X is selected from the group consisting of: 75% of X and 100% of X.

10. The package substrate of claim 8, wherein the substantial portion of the path length X is 100% of X.

11. The package substrate of claim 6, wherein:
 the at least one first electrically nonconductive region that has the width Y and the path length X is joined by a second electrically nonconductive region at a point along the path length X, and
 a conductive trace extends from the second electrically nonconductive region to one end of the first electrically nonconductive region.

12. The package substrate of claim 11, wherein the first electrically nonconductive region and the second electrically nonconductive region form a "T" shape.

13. The package substrate of claim 6, wherein the at least one first electrically nonconductive region that has the width Y and the path length X extends into one or more of the areas of a layer area from the outer perimeter of that area.

14. The package substrate of claim 1, further including a plurality of μvias, wherein:
  each μvia in the plurality of μvias conductively connects one of the BGA contact pads with a layer in the plurality of layers, and
  the number of μvias that conductively connect a first BGA contact pad of the BGA contact pads with a layer in the plurality of layers differs from the number of μvias that conductively connect a second BGA contact pad of the BGA contact pads with a layer in the plurality of layers.

15. The package substrate of claim 14, wherein:
  the number of μvias that connects each of the BGA contact pads that is connected with a layer in the plurality of layers via one or more μvias is selected from the group consisting of: a) a baseline number of μvias and b) a number of μvias determined according to an amount of current passing through the μvias for that BGA contact pad when i) the die is installed and ii) power is applied to the die through the package substrate.

16. The package substrate of claim 15, wherein the baseline number of μvias is four μvias and the number of μvias determined according to the amount of current passing through the μvias for that BGA contact pad when i) the die is installed and ii) power is applied to the die through the package substrate is greater than or equal to 1 and less than or equal to 12.

17. The package substrate of claim 14, wherein:
  the first BGA contact pad has a nominal diameter of 600 nm,
  the second BGA contact pad has a nominal diameter of 600 nm,
  the number of μvias that conductively connect the first BGA contact pad of the BGA contact pads with a layer in the plurality of layers is greater than or equal to 1 and less than or equal to 12, and
  the number of μvias that conductively connect the second BGA contact pad of the BGA contact pads with a layer in the plurality of layers is greater than or equal to 1 and less than or equal to 12.

18. The package substrate of claim 14, wherein the μvias are each the same diameter.

19. The package substrate of claim 1, wherein at least one of the additional layers interposed between the die-interface layer and the BGA-interface layer includes at least two areas that are electrically isolated from one another within the additional layer and that are conductively connected with the given power rail within the layers.

20. The package substrate of claim 1, wherein the at least two areas are part of a linear array of rectangular areas that are arrayed along a short axis of the rectangular areas.

* * * * *